United States Patent
Hidaka et al.

(10) Patent No.: US 10,892,763 B1
(45) Date of Patent: Jan. 12, 2021

(54) SECOND-ORDER CLOCK RECOVERY USING THREE FEEDBACK PATHS

(71) Applicant: Credo Technology Group Limited, Grand Cayman (KY)

(72) Inventors: Yasuo Hidaka, Cupertino, CA (US); Junqing (Phil) Sun, Fremont, CA (US)

(73) Assignee: Credo Technology Group Limited, Grand Cayman (KY)

(*) Notice: Subject to any disclaimer, the term of this patent is extended or adjusted under 35 U.S.C. 154(b) by 0 days.

(21) Appl. No.: 16/874,261

(22) Filed: May 14, 2020

(51) Int. Cl.
| H03L 7/08 | (2006.01) |
| H03L 7/091 | (2006.01) |
| G06F 1/08 | (2006.01) |
| H03L 7/07 | (2006.01) |

(52) U.S. Cl.
CPC .............. *H03L 7/0807* (2013.01); *G06F 1/08* (2013.01); *H03L 7/07* (2013.01); *H03L 7/091* (2013.01)

(58) Field of Classification Search
CPC ......... H03L 7/07; H03L 7/0807; H03L 7/091; G06F 1/08; H04L 7/00–0029
See application file for complete search history.

(56) References Cited

U.S. PATENT DOCUMENTS

| 4,686,488 | A * | 8/1987 | Attenborough | ......... H03L 7/081 331/15 |
| 5,768,268 | A * | 6/1998 | Kline | .................. H04B 1/0003 370/330 |
| 5,943,369 | A * | 8/1999 | Knutson | ............... H04N 5/4401 375/326 |
| 6,509,773 | B2 * | 1/2003 | Buchwald | ............. H03L 7/0816 327/248 |

(Continued)

FOREIGN PATENT DOCUMENTS

| CN | 1941649 A | 4/2007 |
| CN | 109075992 A | 12/2018 |

OTHER PUBLICATIONS

Analog Integr Circ Sig Process (2008) 55:155-162 DOI 10.1007/10470-008-9159-8 "A high-frequency CMOS multi-modulus divider for PLL frequency synthesizers", Ching-Yuan Yang.

(Continued)

*Primary Examiner* — James M Perez
(74) *Attorney, Agent, or Firm* — Ramey & Schwaller LLP; Daniel J. Krueger

(57) ABSTRACT

An illustrative digital communications receiver and a fractional-N phase lock loop based clock recovery method provide substantially reduced sensitivity to nonlinearities in any included phase interpolators. One receiver embodiment includes: a fractional-N phase lock loop that provides a clock signal; a phase interpolator that applies a controllable phase shift to the clock signal to provide a sampling signal; a sampling element that produces a digital receive signal by sampling an analog receive signal; a timing error estimator that produces a timing error signal; a first feedback path coupling the timing error signal to the phase interpolator to minimize a phase component of the estimated timing error; a second feedback path coupling the timing error signal to the phase interpolator; and a third feedback path coupling the timing error signal to the fractional-N phase lock loop, the second and third feedback paths minimizing a frequency offset component of the estimated timing error.

14 Claims, 4 Drawing Sheets

(56) References Cited

U.S. PATENT DOCUMENTS

| | | | | |
|---|---|---|---|---|
| 6,654,432 | B1* | 11/2003 | O'Shea | H04L 7/042 375/354 |
| 6,678,842 | B1* | 1/2004 | Shaffer | H04L 1/0061 714/700 |
| 7,049,937 | B1* | 5/2006 | Zweig | H01R 13/641 324/66 |
| 7,058,150 | B2* | 6/2006 | Buchwald | H04L 25/03006 375/355 |
| 7,151,430 | B2* | 12/2006 | Mattsson | H01F 27/346 336/200 |
| 7,295,644 | B1* | 11/2007 | Wu | H03L 7/0807 375/375 |
| 7,363,563 | B1* | 4/2008 | Hissen | H04L 1/243 327/144 |
| 7,401,985 | B2* | 7/2008 | Aronson | G02B 6/4416 385/89 |
| 7,777,576 | B2* | 8/2010 | Waheed | G04F 10/005 331/17 |
| 7,786,913 | B2* | 8/2010 | Waheed | H03L 7/0991 341/143 |
| 7,920,081 | B2* | 4/2011 | Waheed | G04F 10/005 341/118 |
| 8,045,670 | B2* | 10/2011 | Waheed | G04F 10/005 375/376 |
| 8,050,373 | B2* | 11/2011 | Buchwald | H04L 25/20 375/356 |
| 8,050,375 | B2* | 11/2011 | Staszewski | G04F 10/005 375/373 |
| 8,183,971 | B2* | 5/2012 | Le Guillou | H03B 5/1841 336/200 |
| 8,351,560 | B2* | 1/2013 | Buchwald | H04L 25/20 375/356 |
| 8,686,776 | B2* | 4/2014 | Lim | H03K 5/13 327/237 |
| 8,841,983 | B2* | 9/2014 | Newton | H01F 27/346 336/200 |
| 8,917,124 | B1* | 12/2014 | Waltari | H03L 7/097 327/147 |
| 9,177,709 | B2* | 11/2015 | Parthasarathy | H01F 17/0013 |
| 9,230,416 | B2* | 1/2016 | Ward | G08B 5/36 |
| 9,322,704 | B1* | 4/2016 | Neveux, Jr. | G02B 6/4416 |
| 9,385,859 | B2* | 7/2016 | Kuan | H04L 7/0087 |
| 9,432,176 | B2* | 8/2016 | Yu | H03L 7/091 |
| 9,667,407 | B1* | 5/2017 | Liu | H03B 5/1228 |
| 9,800,438 | B1* | 10/2017 | Zhang | G01R 31/50 |
| 9,906,358 | B1* | 2/2018 | Tajalli | H03L 7/093 |
| 9,935,664 | B1* | 4/2018 | Dai | H04B 1/082 |
| 9,935,800 | B1* | 4/2018 | He | H04L 25/03057 |
| 9,941,623 | B2* | 4/2018 | Lett | H04N 5/2257 |
| 10,084,623 | B1* | 9/2018 | Mactaggart | H04L 7/033 |
| 10,211,994 | B2* | 2/2019 | Lin | H04L 12/10 |
| 10,305,495 | B2* | 5/2019 | Behel | H03K 5/1508 |
| 10,313,105 | B2* | 6/2019 | Gao | H04L 7/0025 |
| 10,313,165 | B2* | 6/2019 | Cheng | H03F 3/45201 |
| 10,389,515 | B1* | 8/2019 | Chien | H04L 7/0091 |
| 10,447,461 | B2* | 10/2019 | Barrenscheen | G06F 1/3237 |
| 10,447,509 | B1* | 10/2019 | Cai | H04L 27/01 |
| 10,483,910 | B2* | 11/2019 | Gao | H03B 5/1215 |
| 10,727,786 | B2* | 7/2020 | Gao | H01F 5/003 |
| 2001/0055331 | A1* | 12/2001 | Agazzi | H04B 3/235 375/216 |
| 2002/0039394 | A1* | 4/2002 | Buchwald | H03L 7/0816 375/355 |
| 2004/0213337 | A1* | 10/2004 | Li | H04L 27/2657 375/222 |
| 2005/0169417 | A1* | 8/2005 | Amirichimeh | H03M 9/00 375/371 |
| 2005/0207520 | A1* | 9/2005 | Su | H04L 7/005 375/355 |
| 2005/0238126 | A1* | 10/2005 | Ribo | H03L 7/0814 375/355 |
| 2007/0246805 | A1* | 10/2007 | Zhang | H01L 25/0657 257/659 |
| 2007/0280341 | A1* | 12/2007 | Hidaka | H04L 25/03057 375/229 |
| 2007/0280342 | A1* | 12/2007 | Hidaka | H03K 5/159 375/232 |
| 2007/0280383 | A1* | 12/2007 | Hidaka | H04L 25/063 375/346 |
| 2007/0280384 | A1* | 12/2007 | Hidaka | H04L 25/063 375/346 |
| 2007/0280389 | A1* | 12/2007 | Hidaka | H04L 25/03114 375/350 |
| 2007/0280390 | A1* | 12/2007 | Hidaka | H04L 25/063 375/350 |
| 2007/0280391 | A1* | 12/2007 | Hidaka | H04L 25/03019 375/350 |
| 2007/0297209 | A1* | 12/2007 | Hidaka | H04L 25/03343 365/63 |
| 2007/0297248 | A1* | 12/2007 | Hidaka | H04L 25/063 365/189.05 |
| 2007/0300119 | A1* | 12/2007 | Hidaka | H04L 25/063 714/746 |
| 2008/0056344 | A1* | 3/2008 | Hidaka | H04L 25/063 375/232 |
| 2008/0315928 | A1* | 12/2008 | Waheed | H03L 7/0991 327/159 |
| 2008/0315960 | A1* | 12/2008 | Waheed | H04L 27/0014 331/17 |
| 2008/0317187 | A1* | 12/2008 | Waheed | H03M 1/0639 375/376 |
| 2008/0317188 | A1* | 12/2008 | Staszewski | H03L 7/091 375/376 |
| 2010/0283654 | A1* | 11/2010 | Waheed | G04F 10/005 341/166 |
| 2011/0148676 | A1* | 6/2011 | Waheed | H03L 7/091 341/131 |
| 2012/0044034 | A1* | 2/2012 | Nazarian | H01F 17/0013 336/200 |
| 2013/0149995 | A1* | 6/2013 | Guionnet | H04M 15/8083 455/406 |
| 2013/0294490 | A1* | 11/2013 | Chandrasekaran | H04L 1/205 375/226 |
| 2013/0343400 | A1* | 12/2013 | Lusted | H04L 12/413 370/419 |
| 2014/0086264 | A1* | 3/2014 | Lusted | H04L 69/14 370/470 |
| 2014/0126613 | A1* | 5/2014 | Zhang | H04L 7/033 375/219 |
| 2014/1468333 | | 5/2014 | Lusted et al. | |
| 2015/0003505 | A1* | 1/2015 | Lusted | H04L 25/4917 375/224 |
| 2015/0063514 | A1* | 3/2015 | Akita | H04L 7/0087 375/355 |
| 2015/0078495 | A1* | 3/2015 | Hossain | H04L 27/0014 375/346 |
| 2016/0013929 | A1* | 1/2016 | Takanashi | H03L 7/107 375/375 |
| 2016/0337114 | A1* | 11/2016 | Baden | H04J 3/0697 |
| 2017/0310456 | A1* | 10/2017 | Tajalli | H03L 7/0996 |
| 2018/0083638 | A1* | 3/2018 | Tajalli | H03K 19/21 |
| 2018/0083809 | A1* | 3/2018 | Tajalli | H03L 7/0807 |
| 2018/0115410 | A1* | 4/2018 | Tajalli | H04L 7/0087 |
| 2018/0138915 | A1* | 5/2018 | Jenkins | H03L 7/14 |
| 2018/0219513 | A1* | 8/2018 | Gao | H01F 5/003 |
| 2018/0343011 | A1* | 11/2018 | Tajalli | H03L 7/081 |
| 2019/0007055 | A1* | 1/2019 | Nelson | H03L 7/0807 |
| 2019/0081772 | A1* | 3/2019 | Gao | H04L 27/148 |
| 2019/0198602 | A1* | 6/2019 | Liu | H01L 28/10 |
| 2019/0386851 | A1* | 12/2019 | Dai | H04L 49/3054 |
| 2020/0028662 | A1* | 1/2020 | Brown | H04L 7/0091 |
| 2020/0044604 | A1* | 2/2020 | Gao | H03B 5/1228 |
| 2020/0076439 | A1* | 3/2020 | Weeks | H03L 7/0805 |
| 2020/0321967 | A1* | 10/2020 | Tajalli | H03L 7/0896 |

OTHER PUBLICATIONS

Jan W.M. Bergmans, "Digital Baseband Transmission and Recording", Philips Research, endhoven, The Netherland.

(56) References Cited

OTHER PUBLICATIONS

Mueller, Kurt H., et al., Timing Recovery in Digital Synchronous Data Receivers, IEEE Transactions on Communications, May 1976, 516-531, vol. Com-24, No. 5.
High-Speed Baud-Rate Clock Recovery by Faisal A. Musa, (2008).
Rumer, B. "Fighting Jitter in Fibre-Channel Designs." Electronic Engineering Times, (Feb. 1, 2001). Retrieved Aug. 13, 2019, from htttps://www.eetimes.com/document.asp?doc_id=1277249.
IEEE P802.3cd/D1.2, Feb. 3, 2017 (Amendment of IEEE Std 802.3-2015 as amended) IEEE Draft Standard for Ethernet Amendment: Media Access Control Parameters for 50 Gb/s, 100 Gb/s and 200 Gb/s Operation. The Institute of Electrical and Electronics Engineers, Inc., 2017; S.I.: IEEE.
International Search Report and Written Opinion dated Dec. 6, 2017 in International Application No. PCT/CN2017/075961.
LAN/MAN Standards Committee of the IEEE Computer Society. "IEEE Standard for Ethernet" IEEE Std 802.3TM-2015, Sep. 3, 2015 (Sep. 3, 2015).
Mueller and Muller, "Timing recovery in digital synchronous data receivers", IEEE Trans. on Comm.,v24n5, pp. 516-531, May 1976.
Non-Final Office Action for U.S. Appl. No. 16/782,926 dated Jul. 16, 2020.

\* cited by examiner

SECOND-ORDER CLOCK RECOVERY USING THREE FEEDBACK PATHS

BACKGROUND

Digital communications occur between sending and receiving devices over an intermediate communications medium, e.g., a fiberoptic cable or insulated copper wire, having one or more designated communications channels, e.g., carrier wavelengths or frequency bands. Each sending device typically transmits symbols at a fixed symbol rate, while each receiving device detects a potentially corrupted sequence of symbols and attempts to reconstruct the transmitted data.

A "symbol" is a state or significant condition of the channel that persists for a fixed period of time, called a "symbol interval." A symbol may be, for example, an electrical voltage or current level, an optical power level, a phase value, or a particular frequency or wavelength. A change from one channel state to another is called a symbol transition. Each symbol may represent (i.e., encode) one or more binary bits of the data. Alternatively, the data may be represented by symbol transitions, or by sequences of two or more symbols. The simplest digital communication links use only one bit per symbol; a binary '0' is represented by one symbol (e.g., an electrical voltage or current signal within a first range), and binary '1' by another symbol (e.g., an electrical voltage or current signal within a second range).

Channel non-idealities produce dispersion which may cause each symbol to perturb its neighboring symbols, causing intersymbol interference (ISO. As the symbol rate increases, ISI can make it difficult for the receiving device to determine which symbols were sent in each interval, particularly when such ISI is combined with additive noise.

The open literature discloses many equalization and demodulation techniques for recovering digital data from the degraded receive signal even in the presence of ISI. A critical piece of such techniques is a determination of the correct sample timing, as sample timing directly affects the signal to noise ratio of the discrete samples. Strategies for detecting and tracking optimal sample times exist with varying degrees of tradeoff between simplicity and performance, but as sample rates increase well into the tens-of-gigahertz range, silicon-based CMOS circuit implementations approach the device design limits and may fail to provide adequate performance for existing clock recovery solutions.

SUMMARY

Accordingly, there are disclosed herein an illustrative digital communications receiver and an illustrative fractional-N phase lock loop based clock recovery method suitable for use therein. The performance of the illustrative clock recovery method and receiver has substantially reduced sensitivity to nonlinearities in any included phase interpolators.

In a disclosed embodiment an integrated receiver circuit includes: a fractional-N phase lock loop that provides a clock signal; a phase interpolator that applies a controllable phase shift to the clock signal to provide a sampling signal; a sampling element that produces a digital receive signal by sampling an analog receive signal in accordance with the sampling signal; a timing error estimator that produces a timing error signal indicating an estimated timing error of the sampling signal relative to the analog receive signal; a first feedback path coupling the timing error signal to the phase interpolator to minimize a phase component of the estimated timing error; a second feedback path coupling the timing error signal to the phase interpolator; and a third feedback path coupling the timing error signal to the phase lock loop, the second and third feedback paths minimizing a frequency offset component of the estimated timing error.

An illustrative embodiment of a clock recovery method, which may be implemented in an integrated receiver circuit, includes: generating a clock signal using a fractional-N phase lock loop; interpolating a phase of the clock signal with a phase interpolator to produce a sampling signal; sampling an analog receive signal in accordance with the sampling signal to obtain a digital receive signal; producing a timing error signal indicating an estimated timing error of the sampling signal relative to the analog receive signal; coupling the timing error signal to the phase interpolator via a first feedback path to minimize a phase component of the estimated timing error; coupling the timing error signal to the phase interpolator via a second feedback path to minimize a short-term frequency offset component of the estimated timing error; and coupling the timing error signal to the fractional-N phase lock loop via a third feedback path to minimize a long-term frequency offset component of the estimated timing error.

The foregoing circuits and methods may further be embodied as schematics (expressed in a hardware description language) or semiconductor manufacturing process mask patterns (expressed in GDSII or OASIS language) residing on nontransient information storage media.

Each of the foregoing embodiments may be implemented individually or in combination, and may be implemented with any one or more of the following features in any suitable combination: 1. the receiver includes a demodulator that extracts a transmitted symbol stream from the digital receive signal. 2. the second feedback path includes a frequency error accumulator and the third feedback path includes a division-ratio error accumulator. 3. as compared between short-term and long-term variation of the frequency offset component, the frequency error accumulator preferentially responds to short-term variation and the division-ratio error accumulator preferentially responds to long-term variation. 4. the frequency error accumulator comprises a leaky integrator and the division-ratio accumulator comprises an integrator with no leakage. 5. the first feedback path has a programmable phase error scaling coefficient $K_P$, the second feedback path has a programmable frequency error scaling coefficient $K_F$ and a programmable leakage coefficient $K_L$, and the third feedback path has a division-ratio error scaling coefficient $K_D$. 6. the receiver includes a phase error accumulator that is shared by the first and second feedback paths. 7. the first feedback path includes a first phase error accumulator, and the second feedback path includes a frequency error accumulator and a second phase error accumulator separate from the first phase error accumulator. 8. the second feedback path operates at a clock frequency lower than a clock frequency used by the first feedback path.

DETAILED DESCRIPTION

Figure 1:
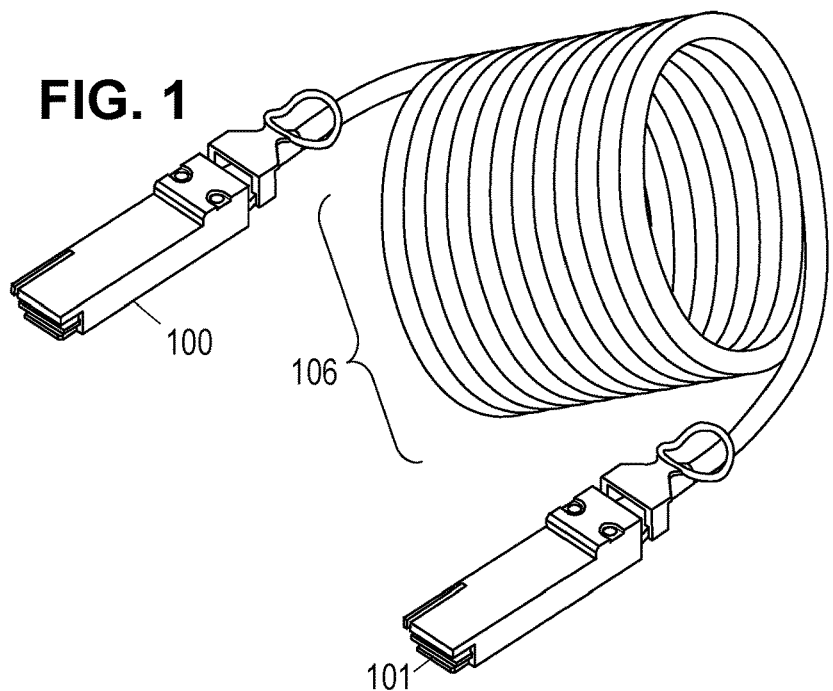
FIG. 1 is a perspective view of an illustrative active Ethernet cable ("AEC").

While specific embodiments are given in the drawings and the following description, keep in mind that they do not limit the disclosure. On the contrary, they provide the foundation for one of ordinary skill to discern the alternative forms, equivalents, and modifications that are encompassed in the scope of the appended claims.

As an illustrative context for the disclosed timing recovery techniques, FIG. 1 shows an illustrative active Ethernet cable ("AEC") that may be used to provide a high-bandwidth communications link between devices in a routing network such as that used for data centers, server farms, and interconnection exchanges. The routing network may be part of, or may include, for example, the Internet, a wide area network, a local area network, or a storage area network. The linked devices may be computers, switches, routers, and the like. The cable includes a first connector 100 and a second connector 101 that are connected via optical or electrical signal conductors 106 in a cord.

To convert between signaling formats (or just to enhance robustness), each connector 100, 101 may include a powered transceiver that performs clock and data recovery ("CDR") and re-modulation of data streams in each direction. Such powered transceivers are also known as data recovery and re-modulation ("DRR") devices. Notably, the transceivers perform CDR and re-modulation not only of the output data streams as they exit the cable, but also of the input data streams as they enter the cable.

The connectors 100, 101 may be pluggable modules compliant with any one of the pluggable module standards, e.g., SFP, SFP-DD, QSFP, QSFP-DD, OSFP. In at least one contemplated embodiment, the cable connectors 100, 101 are quad small form-factor pluggable ("QSFP") transceiver modules, and more specifically, QSFP28 transceiver modules that exchange CAUI-4 data streams with the host. In other contemplated embodiments, the cable connectors are dual small form-factor pluggable ("DSFP") or small form-factor pluggable, double-density ("SFP-DD") transceiver modules, which exchange 100GBASE-KR2 data streams with the host. In still other contemplated embodiments, the cable connectors are different, such as with a QSFP28 to SFP-DD cable, a QSFP28 to DSFP cable, or a SFP-DD to DSFP cable.

Figure 2:
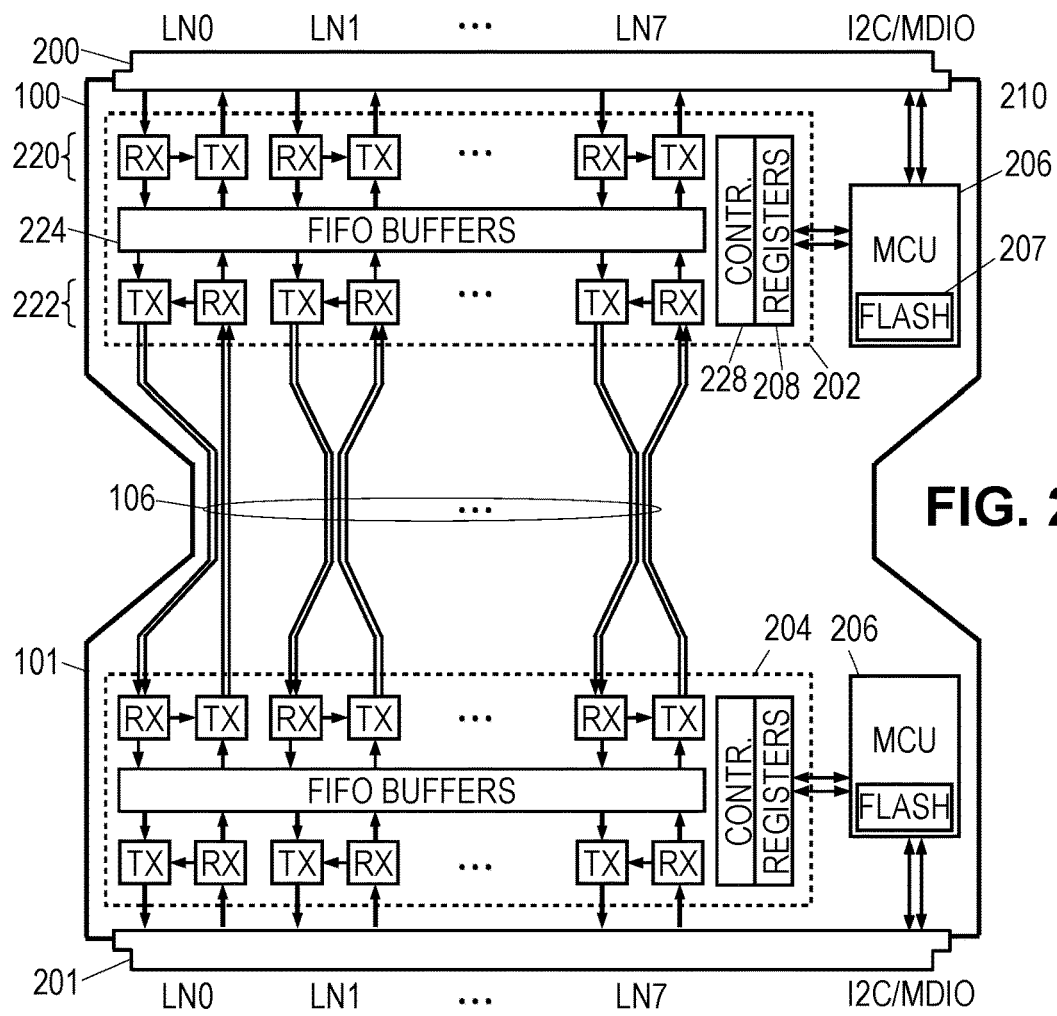
FIG. 2 is a block diagram of an illustrative AEC.

FIG. 2 is a block diagram of an illustrative AEC. Connector 100 includes a plug 200 adapted to fit a standard-compliant Ethernet port in a first host device to receive an electrical input signal carrying a data stream from the host device and to provide an electrical output signal carrying a data stream to the host device. Similarly, connector 101 includes a plug 201 that fits an Ethernet port of a second host device. Connector 100 includes a first DRR device 202 to perform CDR and re-modulation of the data streams entering and exiting the cable at connector 100, and connector 101 includes a second DRR device 204 to perform CDR and re-modulation of the data streams entering and exiting the cable at connector 101. The DRR devices 202, 204 may be integrated circuits mounted on a printed circuit board and connected to edge connector contacts via circuit board traces. The signal conductors 106 may be electrical conductors soldered to corresponding pads on the printed circuit board that electrically connect to the DRR devices.

In at least some contemplated embodiments, the printed circuit boards each also support a micro-controller unit ("MCU") 206. Each DRR device 202, 204 is coupled to a respective MCU device 206 which configures the operation of the DRR device via a first two-wire bus. At power-on, the MCU device 206 loads equalization parameters and/or other operating parameters from Flash memory 207 into the DRR device's configuration registers 208. The host device can access the MCU device 206 via a second two-wire bus that operates in accordance with the I2C bus protocol and/or the faster MDIO protocol. With this access to the MCU device 206, the host device can adjust the cable's operating parameters and monitor the cable's performance.

Each DRR device 202, 204, includes a set 220 of transmitters and receivers for communicating with the host device and a set 222 of transmitters and receivers for sending and receiving via conductor pairs running the length of the cable. The cable-facing transceivers 222 preferably send and receive using differential NRZ at 26.5625 GBd in each direction over each lane, or using differential PAM4 at 26.5625 GBd in each direction over half as many lanes.

The illustrated host-facing transceivers 220 support eight lanes LN0-LN7 for bidirectional communication with the host device, each bidirectional lane formed by two unidirectional connections with differential PAM4 signaling at 26.5625 GBd, such as may be achieved with 400GBASE-KR8. In other contemplated embodiments, the host-facing transceivers 220 support four lanes using differential NRZ signaling in accordance with the CAUI-4 specification. The DRR devices include a memory 224 to provide first-in first-out (FIFO) buffering between the transmitter & receiver sets 220, 222. An embedded controller 228 coordinates the operation of the transmitters and receivers by, e.g., setting initial equalization parameters and ensuring the training phase is complete across all lanes and links before enabling the transmitters and receiver to enter the data transfer phase. The embedded controller 228 employs a set of registers 208 to receive commands and parameter values, and to provide responses potentially including status information and performance data.

The transmitter/receiver sets 220, 222 are Serializer/Deserializer blocks. Serializer blocks convert parallel data streams into (high symbol rate) serial data streams for transmission over a serial channel, while Deserializer blocks convert (high symbol rate) serial data streams received from a serial channel into parallel, lower-rate data streams suitable for handling by more conventional digital circuitry. These conversion blocks are often referred to by the generic term "SerDes". Serializer blocks are coupled to, or may incorporate, channel-specific transmitters, while deserializer blocks are coupled to, or incorporate, channel-specific receivers.

Figure 3:
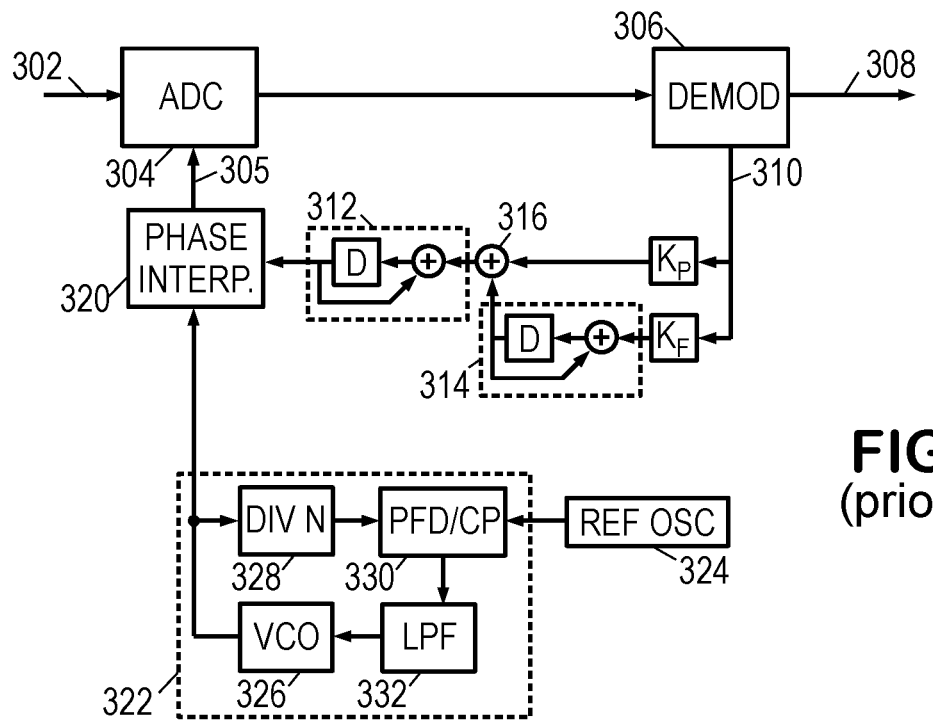
FIG. 3 is a function-block diagram of an illustrative digital communications receiver.

In most SerDes applications, high-speed serial data streams are sent without an accompanying clock signal, so the receiver derives a clock signal directly from the serial data stream. FIG. 3, based on FIG. 3 of co-owned U.S. Pat. No. 10,313,105 ("Fractional-N PLL based clock recovery for SerDes"), shows one CDR technique implemented by an illustrative receiver which may be coupled to, or incorporated in, a deserializer block.

As shown in FIG. 3, each receiver includes an analog-to-digital converter 304 that samples the analog receive signal 302 at sample times corresponding to transitions in a sampling signal 305, thereby providing a digital receive signal to a demodulator 306. The demodulator 306 applies equalization and symbol detection using, e.g., a matched filter, a decision feedback equalizer, a maximum likelihood sequence estimator, or any other suitable demodulation technique. The resulting stream of demodulated symbols 308 may be provided as a parallelized symbol stream for handling by "on-chip" circuitry, e.g., error correction and FIFO buffering.

The demodulator includes some form of a timing error estimator to generate a timing error signal 310. Any suitable design may be used for the timing error estimator including, e.g., a bang-bang or proportional phase detector. One suitable timing error estimator is set forth in co-owned U.S. Pat. No. 10,447,509, "Precompensator-based quantization for clock recovery", which is hereby incorporated herein by reference in its entirety. Other suitable timing error estimators can be found in the open literature, including, e.g., Mueller, "Timing Recovery in Digital Synchronous Data Receivers", IEEE Trans. Commun., v24n5, May 1976, and Musa, "High-speed Baud-Rate Clock Recovery", U. Toronto Thesis, 2008.

In FIG. 3, the timing error signal 310 is coupled via two feedback paths to control a phase interpolator 320 in a fashion that statistically minimizes the timing error signal 310. In the first feedback path, the timing error signal is scaled by a phase coefficient ($K_P$) and integrated by a phase error accumulator 312 to obtain a phase error signal (supplied as a control signal to the phase interpolator 320). In the second feedback path, the timing error signal is scaled by a frequency coefficient ($K_F$) and integrated by a frequency error accumulator 314 to obtain a frequency offset signal. A summer 316 adds the frequency offset signal to the scaled timing error signal, supplying the sum to the phase error accumulator 312.

The phase interpolator 320 also receives a clock signal from a phase lock loop (PLL) 322. The control signal causes the phase interpolator 320 to produce the sampling signal by adjusting the phase of the clock signal in a fashion that minimizes an expected value of the timing error signal. In other words, the control signal compensates for both the frequency offset and phase error of the clock signal relative to the analog receive signal 302, thereby phase-aligning the sampling signal 305 with the data symbols in the analog receive signal 302.

The clock signal produced by PLL 322 is a frequency-multiplied version of a reference clock signal from reference oscillator 324. A voltage controlled oscillator (VCO) 326 supplies the clock signal to both the phase interpolator 320 and to a counter 328 that divides the frequency of the clock signal by a constant modulus N. The counter supplies the divided-frequency clock signal to a phase-frequency detector (PFD) 330. PFD 330 may use a charge pump (CP) as part of determining which input (i.e., the divided-frequency clock signal or the reference clock signal) has transitions earlier or more often than the other. A low pass filter 332 filters the output of PFD 330 to provide a control voltage to VCO 326. The filter coefficients are chosen so that the divided frequency clock becomes phase aligned with the reference oscillator.

Note that for at least some contemplated uses, the reference clock used by the receiver will often drift relative to the reference clock used by the transmitter, and may differ by hundreds of ppm. In the embodiment of FIG. 3, the resulting frequency offset between the PLL's clock signal output and the analog data signal would need to be corrected by continuous phase rotation by the phase interpolator 320. This mode of operation imposes stringent demands on the linearity of the phase interpolator 320 over its entire tuning range, as the interpolator will repeatedly cycle through each of the phase interpolations during the continuous rotation. Any phase interpolation nonlinearity exhibits as periodic jitter in the sampling signal 305, which becomes particularly exaggerated when the incoming signal employs spread spectrum clocking (SSC) to reduce electromagnetic interference.

Figure 4:
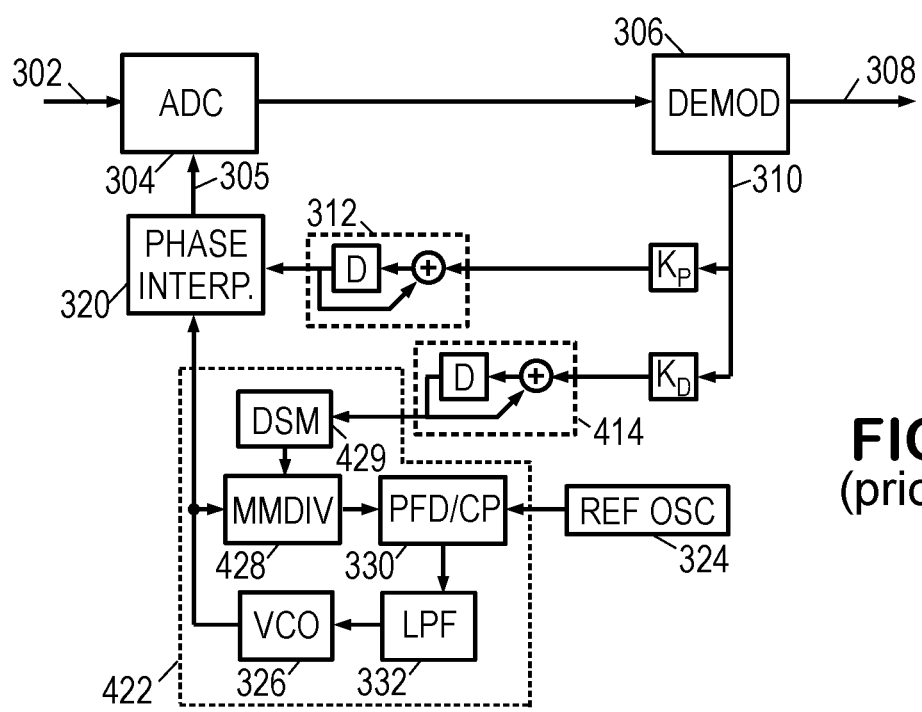
FIG. 4 is a function-block diagram of an illustrative digital communications receiver with a fractional-N phase lock loop.

FIG. 4 provides a receive module that embodies an alternative CDR technique to address this nonlinearity concern. The receive module of FIG. 4 retains the analog-to-digital converter 304 for sampling the analog receive signal 302 and providing a digital receive signal to the demodulator 306. As before, the demodulator includes a timing error estimator that generates a timing error signal 310, and a first feedback path with the phase coefficient ($K_P$) scaling and phase error accumulator 312. However, the second feedback path of the FIG. 3 embodiment is replaced by another (herein termed the "third" feedback path to distinguish it from the first two) feedback path which couples the timing error signal 310 to a fractional-N phase lock loop 422 to correct the frequency offset separately from the phase interpolator 320. The third feedback path includes a division-ratio scaling coefficient ($K_D$) and a division-ratio error accumulator 414, which supplies a division-ratio control signal to the fractional-N phase lock loop 422.

The fractional-N phase lock loop 422 is used in place of the original phase lock loop 322 to provide finer-grained frequency control of the clock signal supplied to the phase interpolator 322. The division-ratio control signal adjusts the frequency offset of the clock signal relative to the data in the analog receive signal 302, substantially reducing the phase rotation rate needed from the phase interpolator 320.

A comparison of FIGS. 3 & 4 shows that the phase lock loop 322 and the fractional-N phase lock loop 422 both employ a PFD/CP 330 (comparing a divided frequency clock signal to the reference clock), low pass filter 332 (filtering the error to reduce noise), and a voltage controlled oscillator 326 (supplying the output clock signal). Rather than dividing the output clock signal with a fixed modulus divider 328, the fractional-N phase lock loop 422 uses a multi-modulus divider 428 that divides by N or N+1, depending on whether the modulus selection signal is asserted at the end of (or, in alternative embodiments, at the beginning of, or at any point during) a count cycle. A delta-sigma modulator (DSM) 429 converts the division-ratio control signal into pulses of the modulus selection signal. The pulse density controls what fractional value between N and N+1 the divider implements, enabling very fine control of the clock frequency supplied to the interpolator 320.

We observe here that despite its disadvantages, the FIG. 3 embodiment offers fast and precise clock recovery from the incoming signal by the digital second-order feedback loop. Moreover, the feedback loop tracking characteristics can be easily adjusted using the two digital loop constants, $K_P$ and $K_F$, making it possible to separate those considerations from the specific metrics for the analog circuit components (e.g., minimizing jitter in the PLL design, or enhancing the linearity of the phase interpolator). Such modularity is advantageous because design requirements often vary between applications, making it possible to, e.g., employ more efficient components in applications having higher jitter tolerance, without requiring re-engineering of the feedback loops.

The FIG. 4 embodiment addresses the phase interpolator nonlinearity disadvantage by correcting the phase offset with the PLL and thereby reducing the rotation rate of the phase interpolator to near zero. However, in applications requiring low clock jitter, the bandwidth of the low pass filter 332 is very limited, slowing the responsiveness of the third feedback path. FIG. 4 embodiment cannot feasibly offer both low clock jitter and fast response, though some careful optimization could be accomplished by sacrificing the separation between PLL design metrics and the tailoring of feedback loop tracking characteristics.

Figure 5:
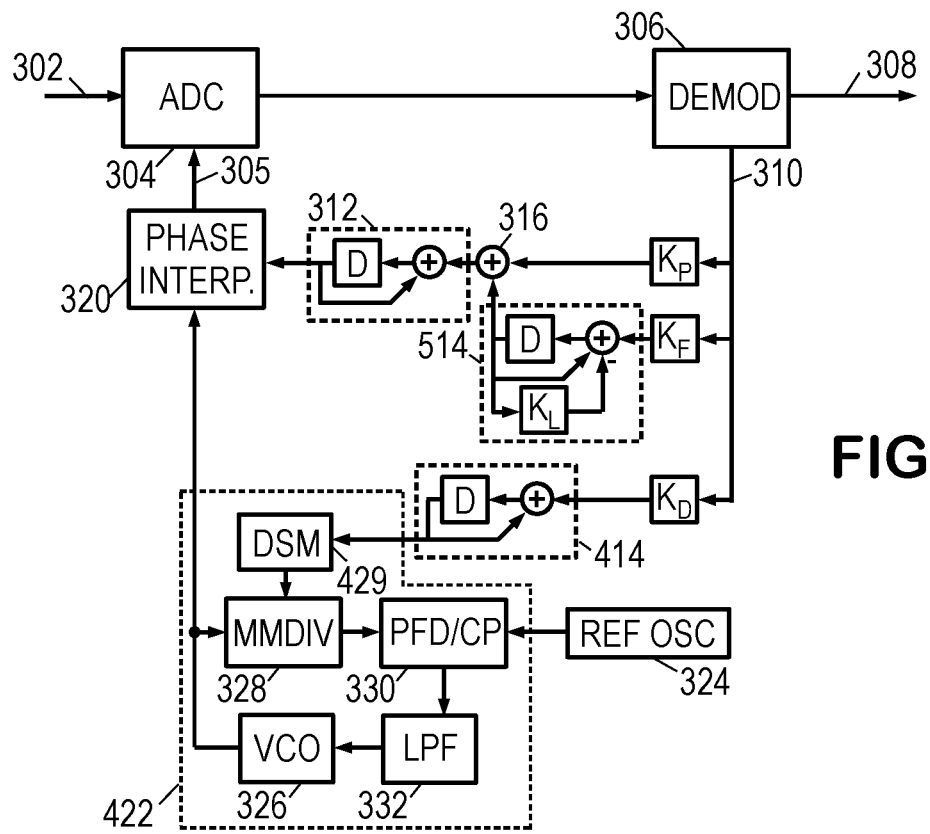
FIG. 5 is a function-block diagram of an illustrative digital communications receiver.

We turn now to FIG. 5, which shows a receiver that includes the first and second feedback paths of the FIG. 3 embodiment, as well as the third feedback path of the FIG. 4 embodiment. To ensure the second and third feedback paths operate in a cooperative rather than contentious fashion, thereby enabling the FIG. 5 embodiment to provide fast and precise clock recovery without undue jitter from non-linearities in the phase interpolator, a modified frequency error accumulator 514 replaces the frequency error accumulator 314 of the FIG. 3 embodiment.

The modified frequency error accumulator 514 is a "leaky" integrator, with the frequency offset signal being multiplied by $(1-K_L)$ in each integration cycle. The leakage coefficient ($K_L$) represents a gradual memory loss which, while it enables the second feedback path to provide a fast response, causes the frequency offset signal to tend toward zero over longer time scales. The division-ratio error accumulator 414, in combination with the low pass filter 332 of the phase lock loop 422, operates on the longer time scale to overcome the memory loss of the modified accumulator 514. Under steady-state or slow-changing conditions, the frequency offset correction is provided by the third feedback path, minimizing any effect of the phase interpolator non-linearities. Where conditions where the frequency offset changes more quickly, the more transient corrections are provided by the first and second feedback paths. Though this situation potentially incurs some periodic jitter due to the interpolator nonlinearities, jitter may be less of a concern under these conditions.

The first feedback path is a first-order loop, having only the phase error accumulator 312. The second feedback path is a second order loop, including both the frequency error accumulator 514 and the phase error accumulator 312. The third feedback path is also a second order loop, including the division-ratio error accumulator 414 and the voltage controlled oscillator 326. The overlap in the first and second feedback paths (i.e., the shared phase error accumulator) is not a requirement; they can be separated as shown in FIG. 6.

Figure 6:
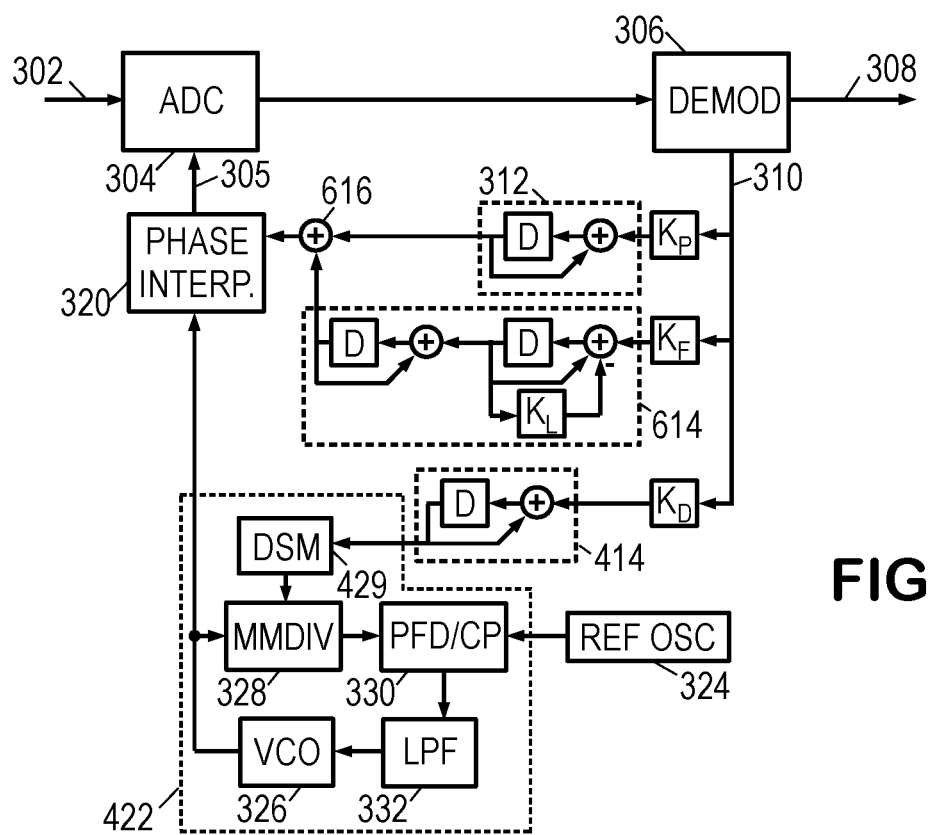
FIG. 6 is a function-block diagram of an illustrative digital communications receiver with a fractional-N phase lock loop.

In FIG. 6, the phase error accumulator 312 integrates the scaled time error signal 310, providing a phase error signal to a summer 616. A second-order frequency error accumulator 614 integrates the scaled time error signal 310, providing a frequency-phase error signal to the summer 616. The summer 616 adds the phase error signal to the frequency-phase error signal to form a control signal for the phase interpolator 320. The third feedback path is unchanged relative to the embodiment of FIG. 5.

The FIG. 6 embodiment enables the first and second feedback paths to be driven at different clock frequencies, which may be advantageous as the second feedback path may often not need to be as responsive as the first feedback path.

In the embodiments of FIGS. 5 and 6, the feedback paths operate as follows:

A change of phase of the incoming signal is primarily tracked by the first feedback path (the first-order loop). The loop constants for the second and third feedback paths are set to sufficiently small value so that they essentially do not respond to the change of phase.

A change of frequency of the incoming signal over the short term is primarily tracked by the second feedback path (the first second-order loop). The output of the frequency error accumulator indicates the updated frequency offset including the short-term change of the frequency of the incoming signal. The response of the third feedback path (the second second-order loop) is slow because the loop includes the LPF 332 of the PLL.

A change of frequency of the incoming signal in a long term is primarily tracked by the third feedback path (the second second-order loop). Although the response of the second second-order loop is slow, it can track a long-term change of frequency of the incoming signal. Thus, the change of frequency is first tracked by the first second-order loop, and it is later taken over by the second second-order loop. If the leakage constant $K_L$ is not zero, the output of the frequency error accumulator eventually converges to zero, and the frequency tracking by the first second-order loop is completely taken over by the second second-order loop for a long term.

The distinction between "short term" and "long term" changes depends on the relative responses of the accumulators, which in turn will depend on the application context. To meet various requirements of jitter tolerance of different applications, we can adjust the loop characteristics of the clock recovery by the loop constants ($K_P$, $K_F$, $K_D$) and the leakage constant ($K_L$). There is no need to re-design critical analog circuits such as PLL and phase interpolator. As one example, the loop constants may be chosen to make the second feedback path responsive to timing error trends lasting for at least ten symbol intervals but with sufficient leakage and third-path responsiveness to limit the second path's response to any timing error trends lasting beyond, say, 1000 symbol intervals. With appropriate values for these coefficients, the receiver can support spread-spectrum clocking.

Figure 7:
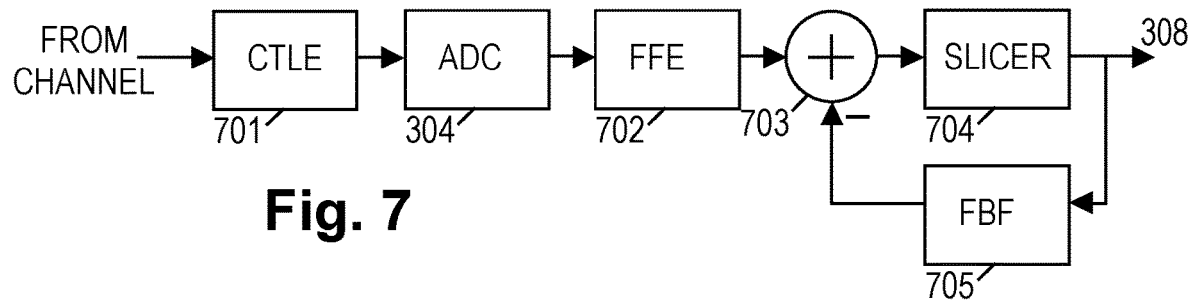
FIG. 7 is a block diagram of an illustrative decision feedback equalizer ("DFE").
Figure 8:
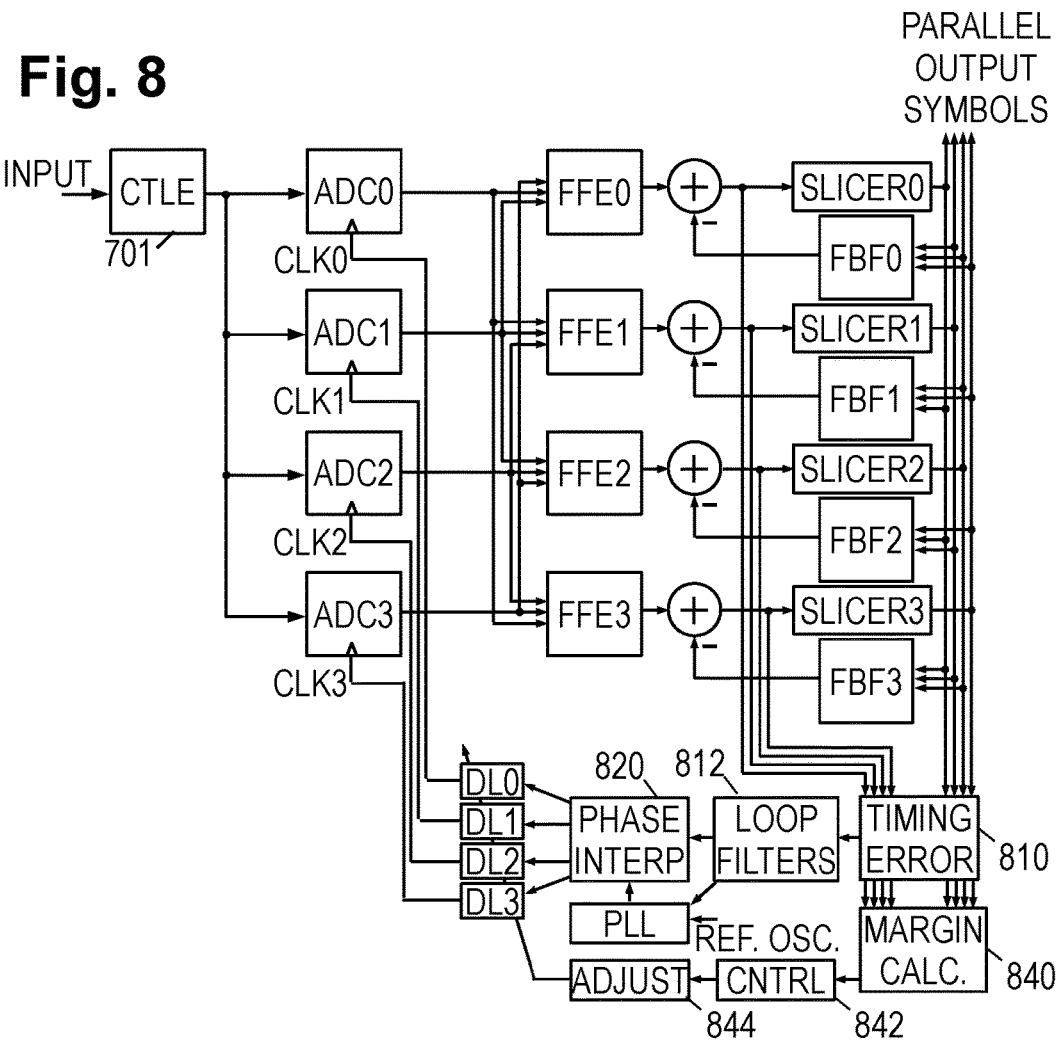
FIG. 8 is a block diagram of an illustrative parallelized DFE.

FIGS. 7 and 8 show illustrative receiver embodiments to provide additional detail for implementation of the demodulator 306, as well as insight into the adaptation of the feedback paths for parallelization.

FIG. 7 shows an illustrative digital receiver that includes a continuous time linear equalizer ("CTLE") 701 to attenuate out-of-band noise and to optionally provide some spectral shaping to improve a response to high-frequency components of the receive signal. ADC 304 is provided to digitize the receive signal, and a digital filter (also known as a feed-forward equalizer or "FFE") 702 performs further equalization to further shape the overall channel response of the system and minimize the effects of leading ISI on the current symbol. As part of the shaping of the overall channel response, the FFE 702 may also be designed to shorten the channel response of the filtered signal while minimizing any attendant noise enhancement.

A summer 703 subtracts an optional feedback signal from the output of FFE 702 to minimize the effects of trailing ISI on the current symbol, yielding an equalized signal that is coupled to a decision element ("slicer") 704. The decision element includes one or more comparators that compare the equalized signal to corresponding decision thresholds to determine for each symbol interval which constellation symbol the signal's value most closely corresponds to. The equalized signal may also be termed a "combined signal" herein.

The decision element 704 accordingly produces a sequence of symbol decisions (denoted $A_k$, where k is the time index). In certain contemplated embodiments, the signal constellation is a bipolar (non-return-to-zero) constellation representing −1 and +1, necessitating only one comparator using a decision threshold of zero. In certain other contemplated embodiments, the signal constellation is PAM4 (−3, −1, +1, +3), necessitating three comparators employing the respective decision thresholds −2, 0, and +2. (The unit for expressing symbol and threshold values is omitted for generality, but for explanatory purposes may be presumed to be volts. In practice, a scale factor will be employed.)

A feedback filter ("FBF") 705 derives the feedback signal using a series of delay elements (e.g., latches, flip flops, or registers) that store the recent output symbol decisions ($A_{k-1}$, $A_{k-2}$, ..., $A_{k-N}$, where N is the number of filter coefficients $f_i$). Each stored symbol is multiplied with a corresponding filter coefficient $f_i$, and the products are combined to obtain the feedback signal.

As an aside, we note here that the receiver also includes a filter coefficient adaptation unit, but such considerations are addressed in the literature and are well known to those skilled in the art. Nevertheless, we note here that at least some contemplated embodiments include one or more additional comparators in the decision element 704 to be employed for comparing the combined signal to one or more of the symbol values, thereby providing an error signal that can be used for timing recovery and/or coefficient adaptation.

As the symbol rates increase into the gigahertz range, it becomes increasingly difficult for the ADC 304 and demodulator 306 components to perform their required operations completely within each symbol interval, at which point it becomes advantageous to parallelize their operations. Parallelization generally involves the use of multiple components that share the workload by taking turns, and thereby providing more time for each of the individual components to complete their operations. Such parallel components are driven by a set of staggered clock signals. For example, a four-fold parallelization employs a set of four clock signals, each having a frequency that is one-fourth of the symbol rate so that each symbol interval contains only one upward transition in the set of staggered clock signals. Though a four-fold parallelization is used for discussion purposes here, the actual degree of parallelization can be higher, e.g., 8-, 16-, 32-, or 64-fold. Moreover, the degree of parallelization is not limited to powers-of-two.

FIG. 8 shows an illustrative receiver having a parallelized equalizer implementation (including the optional feedback filters for DFE). As with the implementation of FIG. 7, the CTLE 701 filters the channel signal to provide a receive signal, which is supplied in parallel to an array of analog-to-digital converters (ADC0-ADC3). Each of the ADC elements is provided with a respective one of the staggered clock signals. The clock signals have different phases, causing the ADC elements to take turns sampling and digitizing the receive signal, so that only one of the ADC element outputs is transitioning at any given time.

An array of FFEs (FFE0-FFE3), each forms a weighted sum of the ADC element outputs. The weighted sums employ filter coefficients that are cyclically shifted relative to each other. FFE0 operates on the held signals from ADC3 (the element operating prior to CLK0), ADC0 (the element responding to CLK0), and ADC1 (the element operating subsequent to CLK0), such that during the assertion of CLK2, the weighted sum produced by FFE0 corresponds to the output of FFE 702 (FIG. 7). FFE1 operates on the held signals from ADC0 (the element operating prior to CLK1), ADC1 (the element responding to CLK1), and ADC2 (the element operating subsequent to CLK1), such that during the assertion of CLK3, the weighted sum corresponds to that of FFE 702. And the operation of the remaining FFEs in the array follows the same pattern with the relevant phase shifts. In practice, the number of filter taps may be smaller, or the number of elements in the array may be larger, so as to offer a longer window of valid output.

As with the receiver of FIG. 7, a summer may combine the output of each FFE with a feedback signal to provide an equalized signal to a corresponding decision element. FIG. 8 shows an array of decision elements (Slicer0-Slicer3), each operating on an equalized signal derived from a respective FFE output. As with the decision element of FIG. 7, the illustrated decision elements employ comparators to determine which symbol the equalized signal most likely represents. The decisions are made while the respective FFE outputs are valid (e.g., Slicer0 operates while CLK2 is asserted, Slicer1 operates while CLK3 is asserted, etc.). Preferably the decisions are provided in parallel on an output bus to enable a lower clock rate to be used for subsequent operations.

An array of feedback filters (FBF0-FBF3) operates on the preceding symbol decisions to provide the feedback signals for the summers. As with the FFEs, the inputs for the FBFs are shifted cyclically and provide a valid output only when the inputs correspond to the contents of the FBF 705 (FIG. 7), coinciding with the time window for the corresponding FFE. In practice, the number of feedback filter taps may be smaller than what is shown, or the number of array elements may be larger, so as to offer a longer window of valid output.

As with the decision element of FIG. 7, the decision elements in FIG. 8 may each employ additional comparators to provide timing recovery info, coefficient training info, and/or precomputation to unroll one or more taps of the feedback filter. In the embodiment of FIG. 8, the digital timing circuit is also parallelized, with a timing error estimator 810 accepting symbol decisions and equalized signals in parallel to determine a parallelized version of the timing error signal 310 (FIG. 3). A set of timing loop filters 812 implement the first, second, and third feedback paths to provide a control signal for the phase interpolator 820 and division-ratio control signal for the PLL. The phase interpolator 820 operates similarly to phase interpolator 320 to convert the PLL clock signal into a set of staggered clock signals having evenly spaced phases with symbol-aligned transitions. A set of delay lines (DL0-DL3) is provided for fine-tuning the individual clock phases relative to each other as needed to, e.g., compensate for different propagation delays of individual ADC elements.

The delay lines may be individually adjusted by a clock skew adjustment circuit 844 based on parameters from a controller 842. The controller 842 may optimize the clock skew adjustment settings based on a reliability indicator from a monitor circuit. In FIG. 8, the monitor circuit is a margin calculator 840 that calculates the minimum difference between the equalized signal and the decision threshold (or equivalently, the maximum error between the equalized signal and the nominal symbol value). Clock skew adjustments are described in greater detail in co-owned U.S. application Ser. No. 16/836,553, "Eye Monitor for Parallelized Digital Equalizers", filed 2020 Mar. 31, which is hereby incorporated herein by reference in its entirety.

The foregoing integrated circuits would typically be created using masks for patterning layers on semiconductor substrates during an integrated circuit manufacturing process. The mask patterns can be generated using commercially available software for converting the circuit schematics (usually expressed using a hardware description language such as Verilog) into semiconductor process masks. The circuits may be sub-units of more complex integrated circuit devices whose designs have been built up from modular components in a design database which resides on nontransient information storage media. Once fully designed, software may convert the integrated circuits into semiconductor mask patterns also stored on nontransient information storage media and conveyed to the various process units in a suitable assembly line of an integrated circuit manufactory.

Numerous alternative forms, equivalents, and modifications will become apparent to those skilled in the art once the above disclosure is fully appreciated. For example, the foregoing description focuses on the use of integration-based accumulators, but other recursive or moving-average filter implementations providing a low-pass filter response can alternatively be employed. It is intended that the claims be interpreted to embrace all such alternative forms, equivalents, and modifications that are encompassed in the scope of the appended claims.

What is claimed is:

1. An integrated receiver circuit that comprises:
   a fractional-N phase lock loop that provides a clock signal;
   a phase interpolator that applies a controllable phase shift to the clock signal to provide a sampling signal;
   a sampling element that produces a digital receive signal by sampling an analog receive signal in accordance with the sampling signal;
   a timing error estimator that produces a timing error signal indicating an estimated timing error of the sampling signal relative to the analog receive signal;
   at least one feedback path coupling the timing error signal to the phase interpolator, the at least one feedback path using a phase error accumulator to minimize a phase component of the estimated timing error and using a frequency error accumulator to minimize a frequency offset component of the estimated timing error; and
   an additional feedback path coupling the timing error signal to the fractional-N phase lock loop to minimize the frequency offset component of the estimated timing error in parallel with said at least one feedback path.

2. The integrated receiver circuit of claim 1, further comprising a demodulator that extracts a transmitted symbol stream from the digital receive signal.

3. The integrated receiver circuit of claim 1, wherein the additional feedback path includes a division-ratio error accumulator.

4. The integrated receiver circuit of claim 3, wherein as compared between short-term and long-term variation of the frequency offset component, the frequency error accumulator preferentially responds to short-term variation and the division-ratio error accumulator preferentially responds to long-term variation.

5. The integrated receiver circuit of claim 4, wherein the frequency error accumulator comprises a leaky integrator and the division-ratio accumulator comprises an integrator with no leakage.

6. The integrated receiver circuit of claim 5, wherein the at least one feedback path has a programmable phase error scaling coefficient $K_P$, a programmable frequency error scaling coefficient $K_F$, and a programmable leakage coefficient $K_L$, and the additional feedback path has a division-ratio error scaling coefficient $K_D$.

7. The integrated receiver circuit of claim 1, wherein the phase error accumulator accumulates a combination of the timing error signal with a frequency offset signal from the frequency error accumulator.

8. The integrated receiver circuit of claim 1, wherein the phase error accumulator accumulates a scaled timing error signal and the at least one feedback path includes a second phase error accumulator that accumulates a frequency offset signal from the frequency error accumulator.

9. The integrated receiver circuit of claim 8, wherein the frequency error accumulator operates at a clock frequency lower than a clock frequency used by the phase error accumulator that accumulates the scaled timing error signal.

10. A clock recovery method that comprises, in an integrated receiver circuit:
    generating a clock signal using a fractional-N phase lock loop;
    interpolating a phase of the clock signal with a phase interpolator to produce a sampling signal;
    sampling an analog receive signal in accordance with the sampling signal to obtain a digital receive signal;
    producing a timing error signal indicating an estimated timing error of the sampling signal relative to the analog receive signal;
    coupling the timing error signal to the phase interpolator via a first feedback path to minimize a phase component of the estimated timing error;
    coupling the timing error signal to the phase interpolator via a second feedback path to minimize a short-term frequency offset component of the estimated timing error; and
    coupling the timing error signal to the fractional-N phase lock loop via a third feedback path to minimize a long-term frequency offset component of the estimated timing error.

11. The clock recovery method of claim 10, further comprising demodulating the digital receive signal to extract a transmitted symbol stream.

12. The clock recovery method of claim 10, wherein the second feedback path includes a frequency error accumulator and the third feedback path includes a division-ratio error accumulator.

13. The clock recovery method of claim 12, wherein the frequency error accumulator comprises a leaky integrator and the division-ratio accumulator comprises an integrator with no leakage.

14. The clock recovery method of claim 13, wherein the first feedback path has a programmable phase error scaling coefficient $K_P$, the second feedback path has a programmable frequency error scaling coefficient $K_F$ and a programmable leakage coefficient $K_L$, and the third feedback path has a division-ratio error scaling coefficient $K_D$.

* * * * *